(12) United States Patent
Masumoto et al.

(10) Patent No.: US 10,879,359 B2
(45) Date of Patent: Dec. 29, 2020

(54) SILICON CARBIDE EPITAXIAL WAFER HAVING A THICK SILICON CARBIDE LAYER WITH SMALL WRAPAGE AND MANUFACTURING METHOD THEREOF

(71) Applicant: NATIONAL INSTITUTE OF ADVANCED INDUSTRIAL SCIENCE AND TECHNOLOGY, Tokyo (JP)

(72) Inventors: Keiko Masumoto, Nagareyama (JP); Satoshi Segawa, Tsukuba (JP); Kazutoshi Kojima, Tsukuba (JP); Tomohisa Kato, Tsukuba (JP); Toshiyuki Ohno, Tokyo (JP)

(73) Assignee: NATIONAL INSTITUTE OF ADVANCED INDUSTRIAL SCIENCE AND TECHNOLOGY

( * ) Notice: Subject to any disclaimer, the term of this patent is extended or adjusted under 35 U.S.C. 154(b) by 0 days.

(21) Appl. No.: 16/280,083

(22) Filed: Feb. 20, 2019

(65) Prior Publication Data

US 2019/0273136 A1    Sep. 5, 2019

(30) Foreign Application Priority Data

Mar. 2, 2018  (JP) ................................ 2018-038022
Dec. 20, 2018  (JP) ................................ 2018-238852

(51) Int. Cl.
*H01L 29/16* (2006.01)
*H01L 21/02* (2006.01)

(52) U.S. Cl.
CPC .... *H01L 29/1608* (2013.01); *H01L 21/02378* (2013.01); *H01L 21/02529* (2013.01)

(58) Field of Classification Search
CPC .......... H01L 29/1608; H01L 29/66053; H01L 29/66075; H01L 2924/10272; H01L 2924/3511
See application file for complete search history.

(56) References Cited

U.S. PATENT DOCUMENTS

| | | | |
|---|---|---|---|
| 2005/0093101 A1 | 5/2005 | Matsumoto | ................... 257/617 |
| 2016/0181375 A1* | 6/2016 | Horii | ................... H01L 21/0262 257/77 |
| 2018/0251911 A1* | 9/2018 | Kubota | ................... C30B 33/06 |

FOREIGN PATENT DOCUMENTS

| | | | |
|---|---|---|---|
| JP | 2005-136167 A | 5/2005 | |
| JP | 2015-032787 A | 2/2015 | |

\* cited by examiner

*Primary Examiner* — Hoai V Pham
(74) *Attorney, Agent, or Firm* — Ostrolenk Faber LLP (57) ABSTRACT

A silicon carbide epitaxial wafer (10) of the present invention is a silicon carbide epitaxial wafer including: a silicon carbide substrate (1) and a silicon carbide layer (2) provided on a first principal plane (1A) of the silicon carbide substrate (1) and having a film thickness of 100 μm or more, wherein a warpage amount of the silicon carbide epitaxial wafer is −20 μm or more and 20 μm or less.

17 Claims, 6 Drawing Sheets

SILICON CARBIDE EPITAXIAL WAFER HAVING A THICK SILICON CARBIDE LAYER WITH SMALL WRAPAGE AND MANUFACTURING METHOD THEREOF

BACKGROUND OF THE INVENTION

Field of the Invention

The present invention relates to a silicon carbide epitaxial wafer and a method for manufacturing the same.

Description of the Related Art

Power electronics responsible for power conversion (DC/AC conversion and voltage conversion) and control is expected to be a key technology for energy saving.

Although attempts have been made in order to improve the performance of power electronics using silicon (Si) so far, since the theoretical limit has become apparent, silicon carbide (SiC) has been attracting attention as a next generation material.

Silicon carbide (SiC) has excellent performance, such as a dielectric breakdown field strength which is 10 times higher, and a band gap which is 3 times larger, than those of silicon (Si). For this reason, a power device using a silicon carbide single crystal substrate is expected to increase the withstand voltage and reduce the power loss.

The power device is fabricated using a silicon carbide epitaxial wafer having a silicon carbide epitaxial layer formed on a silicon carbide single crystal substrate. The silicon carbide single crystal substrate is obtained by processing a bulk single crystal of silicon carbide fabricated by a sublimation method or the like. The silicon carbide epitaxial layer is formed by a chemical vapor deposition (CVD) method.

Patent Document 1 discloses a silicon carbide epitaxial wafer having an outer diameter of 100 mm or more, of which an amount of warpage (warpage amount) is −100 μm or more and 100 μm or less (preferably −40 μm or more and 40 μm or less) when the substrate temperature is room temperature, and the warpage amount is −1.5 mm or more and 1.5 mm or less when the substrate temperature is 400° C. Further, the film thickness of the epitaxial layer is exemplified as about 5 μm or more and 40 μm or less (see paragraph 0032). The definition of the warpage amount will be described later with reference to FIG. 1.

Patent Document 1 describes that the cause of the increase in the warpage amount at the time of high substrate temperature is due to the stress caused by the residual strain of the formed damaged layer, and discloses a method for removing a portion of the back surface of the silicon carbide substrate in order to reduce the warpage amount. In addition, it is disclosed that the surface roughness is set to be 10 nm or less since whether the damaged layer can be sufficiently removed or not can be confirmed by the surface roughness of the back surface.

PRIOR ART DOCUMENTS

Patent Document

Patent Document 1: Japanese Unexamined Patent Application, First Publication No. 2015-32787

SUMMARY OF THE INVENTION

Problems to be Solved by the Invention

SiC power devices have advanced from those having a withstand voltage in a 1 kV region which is a medium withstand voltage region to those having a withstand voltage in a 5 kV region which is a high withstand voltage region. Furthermore, a full-scale study on the SiC power devices having a withstand voltage of 10 kV or more in an ultra-high withstand voltage region which is assumed to be applied to power transmission and distribution has just begun. At present, high-voltage PIN diodes, high-voltage MOSFETs, IGBTs and the like are known as target devices in the ultra-high withstand voltage region.

In an ultra-high voltage power device having a withstand voltage of 10 kV or more (ultra-high withstand voltage region), compared with a power device having a withstand voltage in a 1 kV region, an epitaxial layer with a so-called thick film (100 μm or more) in which the film thickness of the epitaxial layer is one or more orders of magnitude thicker is required.

The inventors of the present invention have examined the problem which has not become apparent for a silicon carbide epitaxial wafer having an epitaxial layer with such a thick film (100 μm or more) in the medium withstand voltage region and the high withstand voltage region.

According to Patent Document 1, from the film thickness of the epitaxial layer (epitaxially grown layer, which may be referred to as "epi layer" in some cases) exemplified in Patent Document 1, the use in a medium voltage SiC-MOS device (in which the film thickness of the epitaxial layer is about 20 μm) which is currently the focus of the development is assumed. It is thought that warpage in the case of such a film thickness and warpage in the case of being used in a SiC device having a withstand voltage of 10 kV or more such as IGBT (in this case, the film thickness of the epitaxial layer is 100 μm or more (the so-called thick film)) are greatly different. However, there has been no report to date on warpage for silicon carbide epitaxial wafers with a thick film.

Accordingly, the inventors of the present invention have conducted intensive studies on the warpage of the silicon carbide epitaxial wafer having a thick film.

Figure 2:
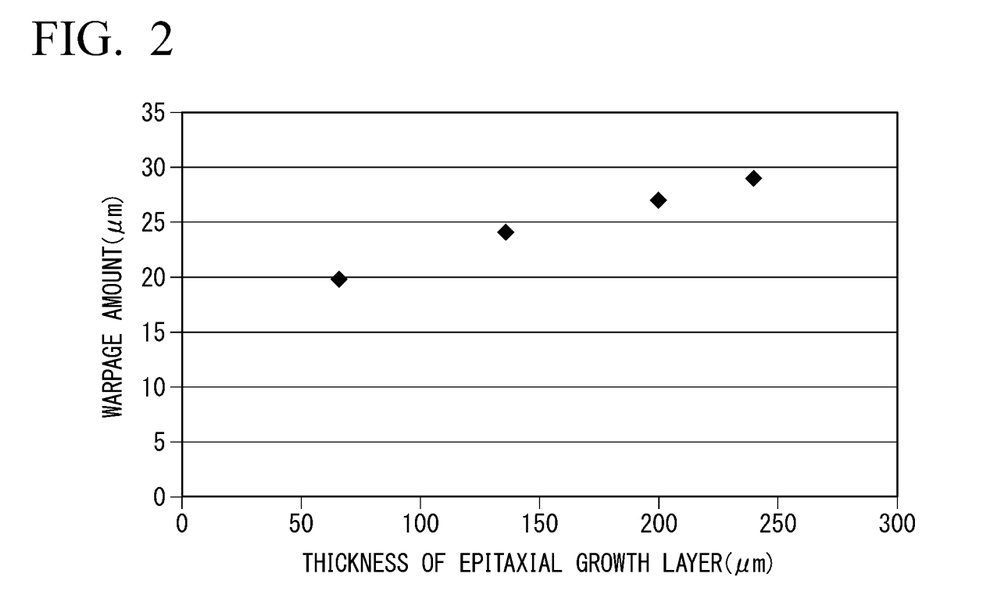
FIG. 2 is a graph showing a result examining a relationship between a film thickness of an epitaxially grown layer of a silicon carbide epitaxial wafer and a warpage amount.

FIG. 2 is a graph showing unpublished results examining the relationship between the film thickness of an epitaxially grown layer of a silicon carbide epitaxial wafer and the warpage amount of the silicon carbide epitaxial wafer which the inventors of the present invention have studied prior to the present application.

A silicon carbide substrate having an outer diameter of 3 inches was used. It should be noted that in the present invention, since the technical idea does not change even if the outer diameter changes, the size of the outer diameter may be 3 inches or less or 3 inches or more.

As the film thickness of the epitaxially grown layer is increased to 65 μm, 140 μm, 200 μm, and 240 μm, the warpage amount increases substantially linearly to 20 μm, 24 μm, 27 μm, and 29 μm, and it is apparent that the change in the warpage amount (μm) is almost proportional to the increase of the film thickness.

From this result, it is clear that the warpage amount of the silicon carbide epitaxial wafer having a thick film will be much larger as compared with the warpage amount when the film thickness is about 20 μm.

Problems caused by the large amount of warpage of a silicon carbide epitaxial wafer having a thick film will be considered.

First of all, wafer cracking can be mentioned. In the first place, when an epitaxial layer becomes thick, the stress applied to the epitaxial wafer becomes large, and the cracks are likely to occur. Accordingly, if the warpage amount also becomes large, the temperature distribution is generated during the high-temperature process, which further promotes the cracking. The warpage amount of −100 μm or more and 100 μm or less (preferably −40 μm or more and 40 μm or less) at room temperature as shown in Patent Document 1 is not satisfactory for the silicon carbide epitaxial wafer having a thick film, and the problem of wafer cracking cannot be avoided.

Next, in the automated transport process, when the epitaxial layer becomes thick, stricter control for the warpage amount will be required.

Figure 3:
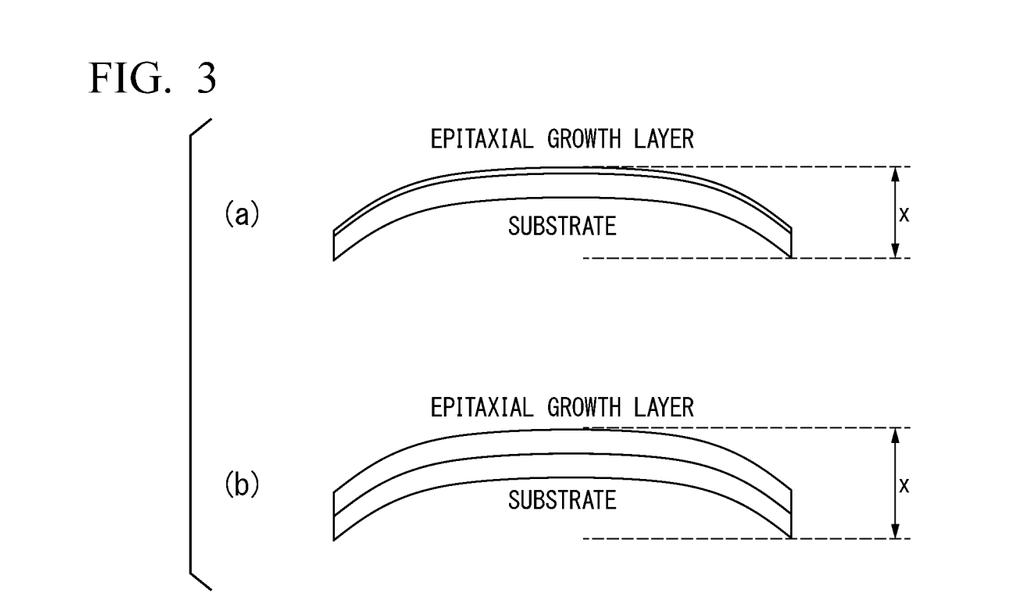
FIG. 3 is schematic cross-sectional views for explaining a difference in a pseudo thickness of an epitaxial wafer due to a thickness of an epitaxial layer. (a) of FIG. 3 shows a case where the epitaxial layer is thin, while (b) of FIG. 3 shows a case where the epitaxial layer is thick.

This issue will be described with reference to FIG. 3. (a) of FIG. 3 shows the case where the film thickness is about 20 μm, and (b) of FIG. 3 shows the case of a thick film (100 μm or more).

Even if the warpage amount is the same, as the epitaxial layer becomes thicker, a pseudo thickness (x) of the epitaxial wafer increases. If the value of this x is too large when confirming the presence of the epitaxial wafer with a laser or the like at the time of automated transport, the presence of the epitaxial wafer cannot be confirmed accurately (for example, it is recognized as two wafers being superimposed), and the risk of causing an error increases.

The present invention has been made in view of the above problems, with an object of providing a silicon carbide epitaxial wafer having a smaller warpage amount than that of a conventional silicon carbide epitaxial wafer, and a manufacturing method thereof.

Means for Solving the Problem

Representative examples of the present invention are as follows.

(1) A silicon carbide epitaxial wafer according to a first aspect of the present invention is a silicon carbide epitaxial wafer including a silicon carbide substrate and a silicon carbide layer provided on a first principal plane of the silicon carbide substrate and having a film thickness of 100 μm or more, wherein a warpage amount of the silicon carbide epitaxial wafer is −20 μm or more and 20 μm or less.

(2) In the above aspect, a surface roughness of a second principal plane opposed to the first principal plane of the silicon carbide substrate may be 20 nm or more.

(3) In the above aspect, a total thickness of the silicon carbide substrate and the silicon carbide layer may be 450 μm or more.

(4) In the above aspect, a total thickness of the silicon carbide substrate and the silicon carbide layer may be 600 μm or more.

(5) In the above aspect, the silicon carbide substrate may be a 4H-SiC substrate.

(6) In the above aspect, an outer diameter of the silicon carbide substrate may be 75 mm or more.

(7) A method for manufacturing a silicon carbide epitaxial wafer according to a second aspect of the present invention includes: a step of preparing a silicon carbide substrate having a first principal plane and a second principal plane opposed thereto, and processing the silicon carbide substrate so that a second principal plane side of the silicon carbide substrate has a convex shape; and a step of epitaxially growing a silicon carbide layer on the first principal plane of the silicon carbide substrate.

(8) In the above aspect, the step of processing the silicon carbide substrate may include a step of polishing and/or grinding so that a surface roughness of the second principal plane is 20 nm or more.

(9) In the above aspect, the epitaxial growth step may include a step of epitaxially growing the silicon carbide layer to a thickness of 100 μm or more.

Effects of the Invention

According to the silicon carbide epitaxial wafer of the present invention, it is possible to provide a silicon carbide epitaxial wafer having a smaller warpage amount than that of the conventional silicon carbide epitaxial wafer.

DETAILED DESCRIPTION OF THE INVENTION

Hereinafter, the present embodiment will be described in detail with appropriate reference to the drawings. In the drawings used in the following description, characteristic portions and components may be shown in an enlarged manner in some cases for the sake of simplicity in order to facilitate understanding of the features of the present invention, and the dimensional ratio or the like of each constituent may be different from that employed in reality. Materials, dimensions, and the like exemplified in the following description are merely examples, and the present invention is not limited thereto and can be carried out with appropriate modifications within a range that achieves the effects of the present invention.

(Silicon Carbide Epitaxial Wafer)

Figure 4:
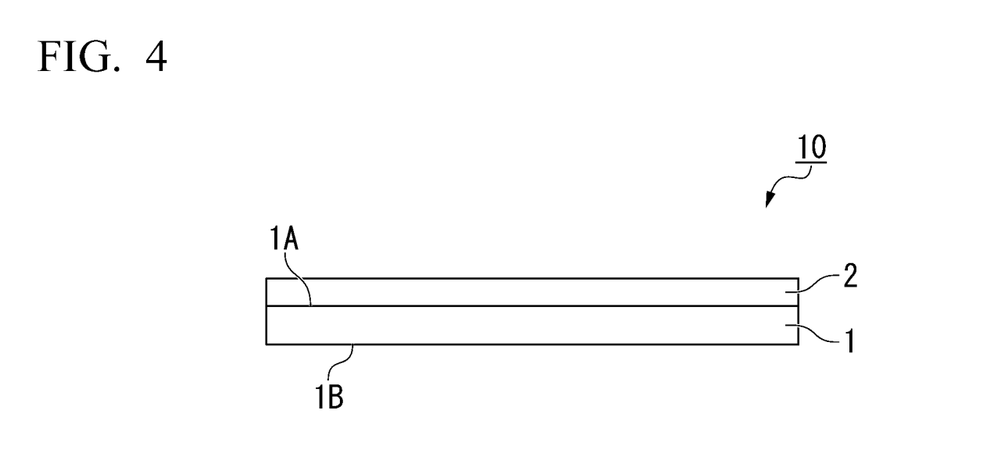
FIG. 4 is a cross-sectional view schematically showing a silicon carbide epitaxial wafer according to one embodiment of the present invention.

FIG. 4 is a cross-sectional view schematically showing a silicon carbide epitaxial wafer 10 according to one embodiment of the present invention.

The silicon carbide epitaxial wafer 10 is a silicon carbide epitaxial wafer including a silicon carbide substrate 1 and a silicon carbide layer 2 provided on a first principal plane 1A of the silicon carbide substrate 1 and having a film thickness of 100 μm or more, wherein a warpage amount of the silicon carbide epitaxial wafer is −20 μm or more and 20 μm or less.

<Definition of Warpage Amount>

Figure 1:
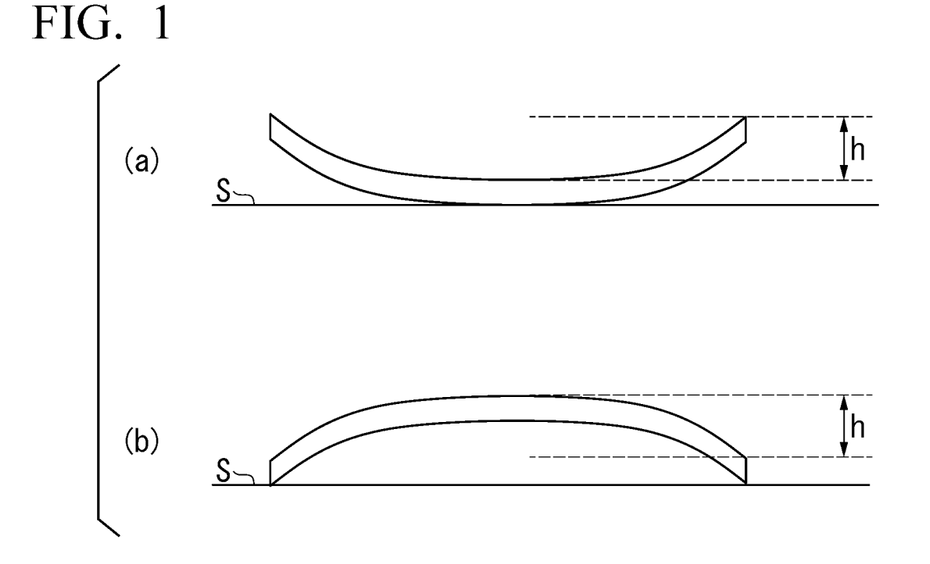
FIG. 1 is schematic cross-sectional views for explaining the definition of a warpage amount of a silicon carbide semiconductor substrate. (a) of FIG. 1 shows a case where a surface side facing a growth surface is warped convexly, while (b) of FIG. 1 shows a case where a growth surface side is warped convexly.

The "warpage amount (amount of warpage)" of a silicon carbide epitaxial wafer is defined as follows. When the silicon carbide epitaxial wafer is placed on a plane S, the warpage amount means a difference in height (h) between the highest position and the lowest position with respect to the plane S in a principal plane (the surface on the side which is not facing the plane S) of the silicon carbide epitaxial wafer. Here, the positive and negative values of the warpage amount can be defined as follows. With reference to (a) of FIG. 1, the warpage amount takes a negative value when the principal plane of the silicon carbide epitaxial wafer is convex downward (in a case where the position of the center of the silicon carbide epitaxial wafer is located lower than the position of the outer periphery with respect to the plane S). With reference to (b) of FIG. 1, the warpage amount takes a positive value when the principal plane of the silicon carbide epitaxial wafer is convex upward (in a case where the position of the center of the silicon carbide epitaxial wafer is located higher than the position of the outer periphery with respect to the plane S).

Hereinafter, with reference to FIG. 1, the term "warpage amount" used in the present specification is defined so that the warpage amount takes a positive value when it is convexly warped toward the growth surface side of the silicon carbide epitaxial layer (corresponding to the case depicted in (b) of FIG. 1), and takes a negative value when it is convexly warped toward a surface side which is opposite to the growth surface (in other words, in the case where it is concavely warped when viewing the growth surface as the upper side, corresponding to the case depicted in (a) of FIG. 1). Further, in the respective cases of positive and negative values, the definition of the warpage amount is as shown in (a) and (b) of FIG. 1.

It should be noted that in the case of a silicon carbide substrate before the formation of an epitaxial layer, since an epi surface on the side where an epi layer is formed and the back surface opposed thereto can be defined, the "warpage amount" is defined in a similar manner with the epi surface being on the upper side and the back surface being on the lower side.

<Silicon Carbide Substrate>

Silicon carbide (SiC) has numerous crystal polymorphs, but those having these crystal polymorphs can be used as the silicon carbide substrate. It is preferably a 4H-SiC substrate since a 4H-SiC substrate is usually used for manufacturing a practical SiC device.

Further, as the silicon carbide substrate, a silicon carbide single crystal substrate obtained by processing a silicon carbide bulk crystal produced by a sublimation method or the like can be used.

Therefore, as the silicon carbide substrate, a 4H-SiC single crystal substrate is preferable.

With respect to the off angle of the silicon carbide substrate, those having any off angle may be used. However, from the viewpoint of cost reduction, those having a small off angle, for example, those having an off angle of 0° or more and 8° or less are preferable.

The thickness of the silicon carbide substrate is not particularly limited, but it can be set to, for example, 200 μm or more and 700 μm or less, and preferably 300 μm or more and 600 μm or less.

As a 4 degrees-off substrate, those having a thickness of 350 μm are often used, but those having a thickness of 500 μm are also commercially available.

It is preferable that the surface roughness of the second principal plane opposing the first principal plane of the silicon carbide substrate is 5 nm or more. Furthermore, the surface roughness of the second principal plane is preferably 20 nm or more.

The surface roughness of the second principal plane is an indicator of a warpage having a convex shape toward the second principal plane (back surface) side of the silicon carbide substrate before the silicon carbide epitaxial layer growth, and is an indicator of compensation for a warpage having a convex shape toward the first principal plane (growth surface) side associated with an increase in the film thickness due to the silicon carbide epitaxial layer growth. If the required thickness of the epitaxially grown layer is determined first, the warpage amount generated by the epi layer can be grasped from FIG. 2. Therefore, the surface roughness of the second principal plane required for the compensation can be selected from FIG. 6.

When considering the recovery of concave warpage (convex warpage toward the second principal plane side) as the silicon carbide substrate by the hydrogen heating step before the silicon carbide epitaxial layer growth to be described later (FIGS. 5 and 6), if the surface roughness of the second principal plane is 5 nm or more, in a 3-inch wafer, the amount of wafer warpage having a convex shape toward the second principal plane side can be maintained at a level of about 10 μm (−10 μm) even after heating with hydrogen.

According to FIG. 2, in the case where a processing treatment for making the back surface to have a convex shape before the epi growth of the present invention is not performed, in the 3-inch wafer, the warpage amount of the silicon carbide epitaxial wafer in which the film thickness of the epi layer is 100 μm is about 22 μm. For this reason, if the surface roughness of the second principal plane of the silicon carbide substrate is set to 5 nm or more, the warpage amount of the silicon carbide epitaxial wafer after completion of the silicon carbide epitaxial wafer is −20 μm or more and 20 μm or less. Based on FIG. 6, when the surface roughness of the second principal plane of the silicon carbide substrate is 120 nm, the warpage amount of the silicon carbide substrate after the hydrogen heating step is about −42 μm. For this reason, even when the surface roughness of the second principal plane is 120 nm, the warpage amount of the silicon carbide epitaxial wafer after completion of the silicon carbide epitaxial wafer is −20 μm or more and 20 μm or less.

Figure 6:
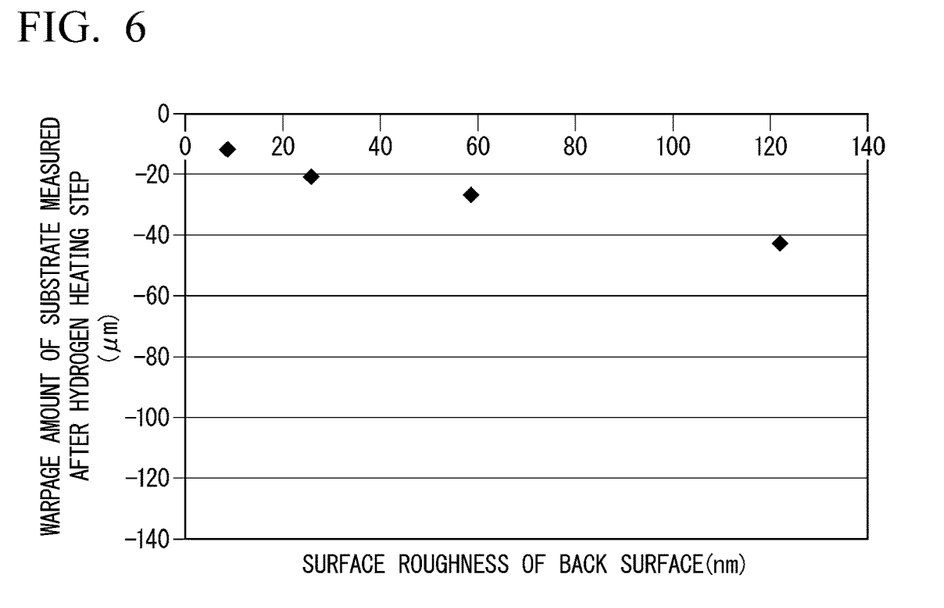
FIG. 6 is a graph showing a relationship between the surface roughness of the second principal plane (back surface) of the silicon carbide substrate and the warpage amount of the silicon carbide substrate after the hydrogen heating step.

Further, based on FIG. 6, if the surface roughness of the second principal plane is about 20 nm, the warpage amount of the silicon carbide substrate after the hydrogen heating step is about −20 µm. For this reason, the warpage amount of the silicon carbide epitaxial wafer becomes close to zero after completion of the silicon carbide epitaxial wafer. That is, when the surface roughness of the second principal plane is 20 nm or more, it is more preferable as a silicon carbide epitaxial wafer having an epi layer of 100 µm or more. As will be described later, when the wafer is enlarged, the warpage amount increases more than the case of the 3-inch wafer. Therefore, it is suitable for controlling the warpage amount with high accuracy.

It should be noted that the method of Patent Document 1 is a method exactly opposite to the method of the present invention, since the damage layer on the back surface is removed to lower the surface roughness of the back surface.

<Silicon Carbide Layer>

The silicon carbide layer is preferably a silicon carbide epitaxial layer.

The film thickness of the silicon carbide layer is 100 µm or more, which corresponds to the thickness of the so-called thick film. This is to make the silicon carbide epitaxial wafer suitable for a high voltage power device.

The optimum film thickness of this epi film is determined according to the design specification of the withstand voltage of the device, and film thicknesses of about 150 µm, 200 µm, and 250 µm will be required for ultra high voltage devices.

The upper limit is exemplified by a film thickness of about 500 µm from the viewpoint of the difficulty in epitaxial growth.

The warpage amount of the silicon carbide epitaxial wafer is −20 µm or more and 20 µm or less.

In the present invention, the method for reducing the warpage amount of the silicon carbide epitaxial wafer is characterized in that before growing an epitaxial layer on the silicon carbide substrate, a surface (second principal plane) of the silicon carbide substrate which is not the growth surface is formed into a convex shape. It is a method of reducing the warpage amount of the silicon carbide epitaxial wafer after the epitaxial layer growth (at the time of completion of the silicon carbide epitaxial wafer) by this process.

It should be noted that in the present specification, the first principal plane (epi layer growth surface) side may be referred to as "upper side", and the second principal plane side on the opposite side of the first principal plane may be referred to as "lower side". Further, with respect to the wafer as a whole which is composed of the silicon carbide epitaxial layer and the silicon carbide substrate, the case where the first principal plane side (upper side) has a convex shape may be referred to as "wafer as a whole having a convex shape" in some cases, while the case where the second principal plane side (lower side) has a convex shape may be referred to as "wafer as a whole having a concave shape" in some cases.

That is, as the silicon carbide epitaxial layer is grown on the silicon carbide substrate, in the wafer composed of the silicon carbide epitaxial layer and the silicon carbide substrate, the warpage on the first principal plane side having a convex shape becomes large. Accordingly, by forming the substrate before the silicon carbide epitaxial layer growth into a convex shape toward the second principal plane side in advance, the warpage amount of the silicon carbide epitaxial wafer after the epitaxial layer growth (at the time of completion of the silicon carbide epitaxial wafer) is reduced.

Figure 8:
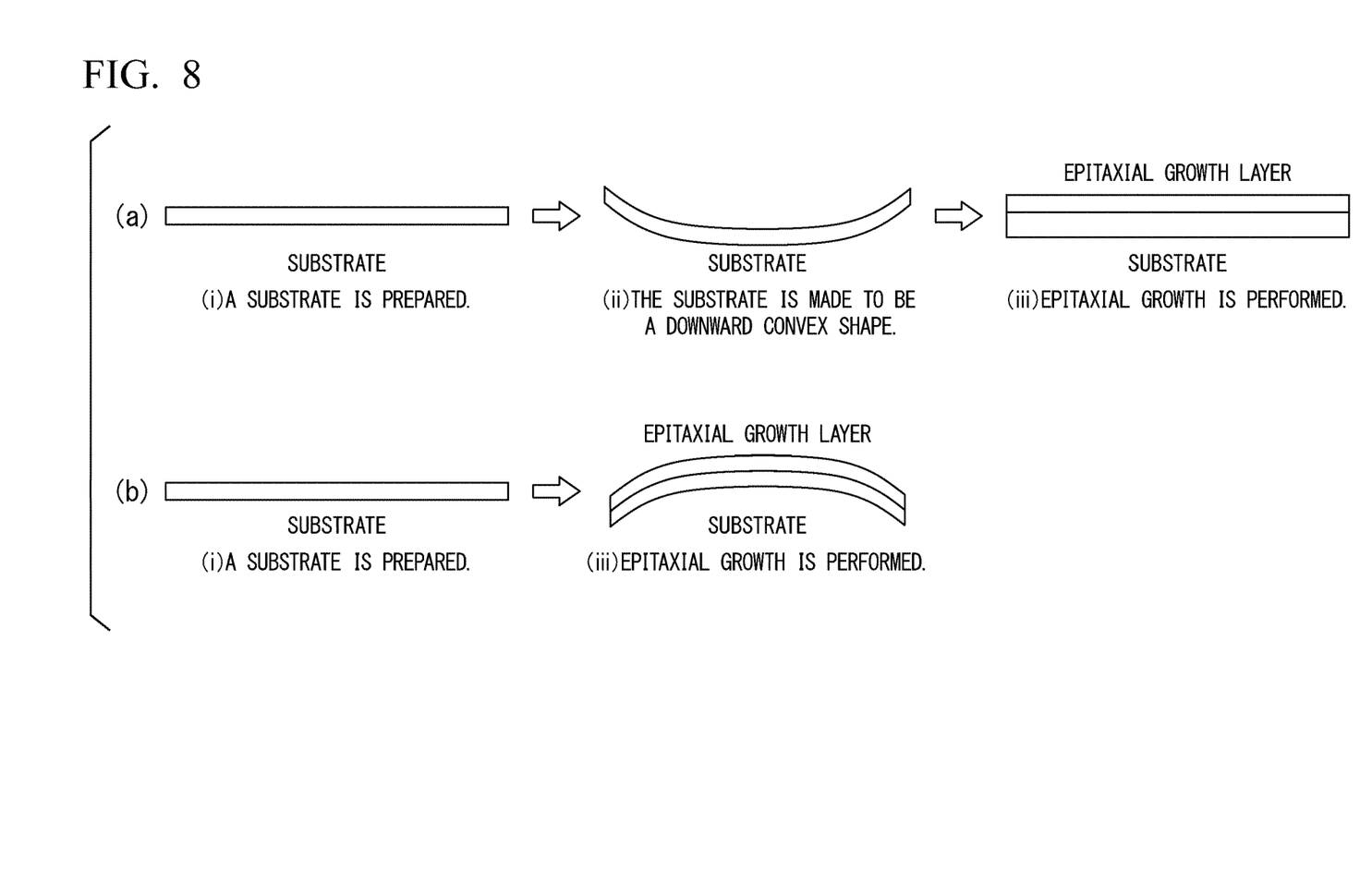
FIG. 8 is process diagrams for explaining a method of manufacturing a silicon carbide epitaxial wafer. (a) of FIG. 8 is a diagram for describing the method of the present invention, while (b) of FIG. 8 is a diagram for describing a conventional method. With reference to (a) and (b) of FIG. 8, the main difference between the method of manufacturing a silicon carbide epitaxial wafer of the present invention and the conventional method of manufacturing a silicon carbide epitaxial wafer will be described.

As a means for making the silicon carbide substrate before the silicon carbide epitaxial layer growth into a convex shape toward the second principal plane (back surface) side, the Twyman effect is utilized. The Twyman effect refers to an effect, when there is a difference in stress (residual stress) on both sides of the substrate, of generating a force to compensate for the unbalance of stress on both sides, thereby generating a warpage. That is, when the surface roughness of the second principal plane of the silicon carbide substrate is increased, the silicon carbide substrate is warped in a convex shape toward the second principal plane (back surface) side by the Twyman effect (see (ii) shown in (a) of FIG. 8).

As the silicon carbide epitaxial layer grows on the first principal plane (front surface, growth surface) of the silicon carbide substrate that is warped in a convex shape toward the second principal plane (back surface) side, with respect to the wafer composed of the silicon carbide epitaxial layer and the silicon carbide substrate, as the film thickness increases, the warpage amount of the wafer as a whole having a concave shape decreases. When the film thickness reaches the predetermined thickness, the warpage amount becomes zero, and as the film thickness further increases, the warpage of the wafer as a whole becomes a convex shape.

If a processing treatment for increasing the surface roughness of the second principal plane is carried out so that the warpage amount of the wafer as a whole is about zero at the time of completion of the silicon carbide epitaxial wafer, that is, so that the silicon carbide substrate before the silicon carbide epitaxial layer growth has a convex shape toward the second principal plane side, the warpage amount of the silicon carbide epitaxial wafer can be set to −20 µm or more and 20 µm or less.

Hereinafter, the relationship between the surface roughness of the second principal plane (back surface) of the silicon carbide substrate and the warpage amount of the wafer will be described. By the way, at the time of epitaxial growth, in order to clean the surface of the silicon carbide substrate, it is common to perform a heat treatment in a hydrogen atmosphere before the start of growth. At this time, since the temperature of the silicon carbide substrate increases, the warpage amount after heating in a hydrogen atmosphere is important.

Figure 5:
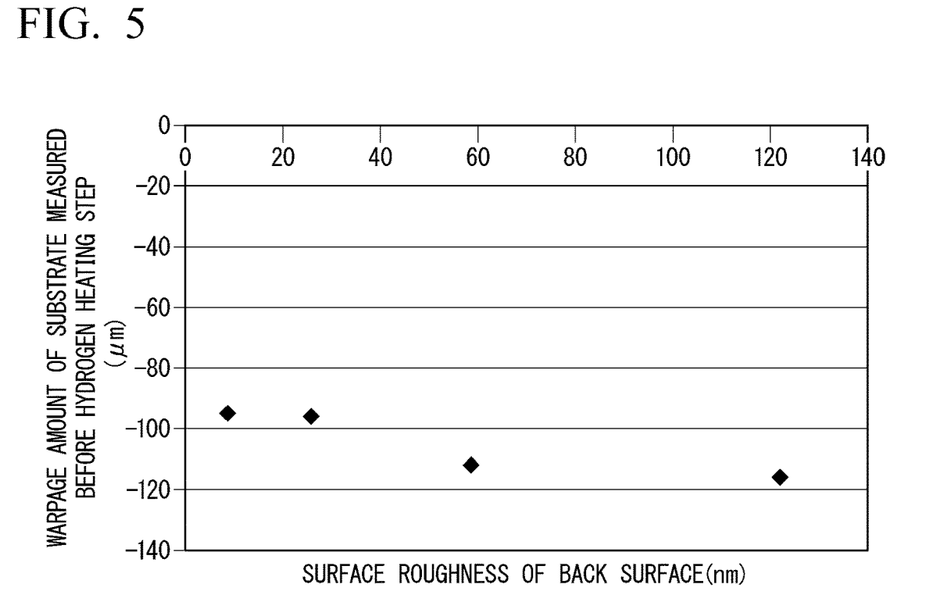
FIG. 5 is a graph showing a relationship between a surface roughness of a second principal plane (back surface) of a silicon carbide substrate and a warpage amount of a silicon carbide substrate before a hydrogen heating step.

Accordingly, the relationships between the surface roughness and the warpage amount of the second principal plane (back surface) of the silicon carbide epitaxial wafer before and after the hydrogen heating step are shown in FIGS. 5 and 6, respectively. FIG. 5 shows the relationship before the hydrogen heating step, and FIG. 6 shows the relationship after the hydrogen heating step. The horizontal axis indicates the surface roughness of the second principal plane (back surface), and the vertical axis indicates the warpage amount.

FIGS. 5 and 6 show results of a case where a 4H-SiC single crystal substrate having an outer diameter of 3 inches, a thickness of 350 µm and an off angle of 4 degrees is used, and the (000-1) C plane side is processed as a second principal plane (back surface) to increase the surface roughness.

Comparing FIG. 5 with FIG. 6, a concave warpage (convex warpage toward the second principal plane side) as the silicon carbide substrate is recovered by the hydrogen heating step, but by increasing the surface roughness of the second principal plane, it is possible to increase the concave warpage.

From these results, it is clear that in order to suppress the warpage of the silicon carbide epitaxial wafer to 20 µm or less, the extent of increase in the warpage may be assumed from the thickness of the growing epitaxial layer to appropriately adjust the surface roughness of the second principal plane of the silicon carbide substrate.

Although the silicon carbide epitaxial layer can be formed on either the Si plane or the C plane, it is preferably formed on the Si plane.

The total thickness of the silicon carbide substrate and the silicon carbide layer (that is, the thickness of the silicon carbide epitaxial wafer) can be set to 450 μm or more.

For example, this corresponds to the case where the thickness of the silicon carbide substrate is 350 μm and the thickness of the silicon carbide layer is 100 nm.

The total thickness of the silicon carbide substrate and the silicon carbide layer (that is, the thickness of the silicon carbide epitaxial wafer) can be set to 600 μm or more.

For example, this corresponds to the case where the thickness of the silicon carbide substrate is 350 μm and the thickness of the silicon carbide layer is 250 μm.

The outer diameter of the silicon carbide substrate can be set to 75 mm or more.

Figure 7:
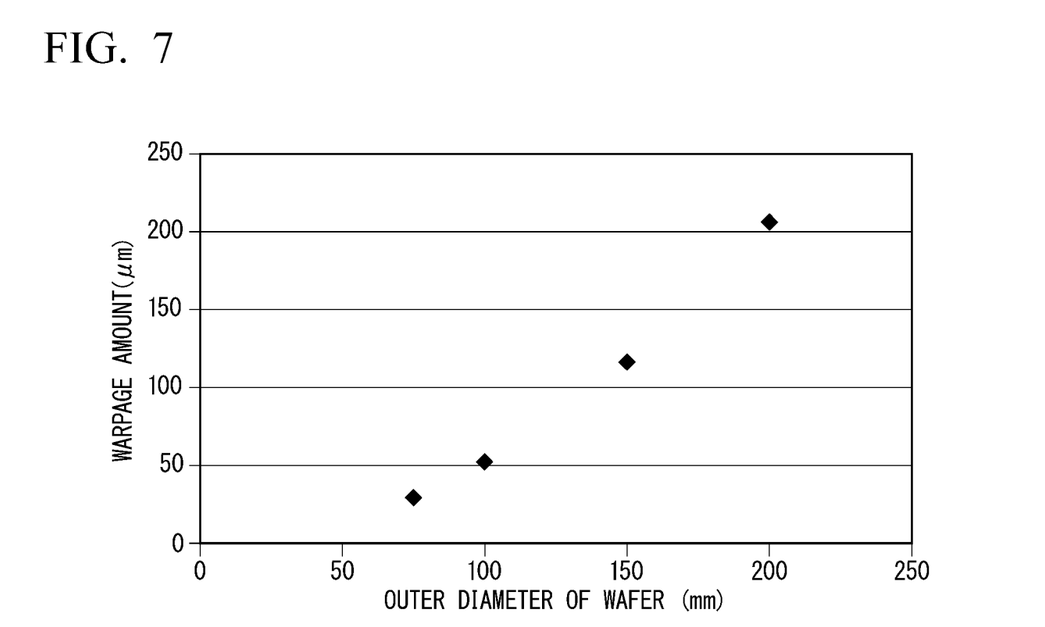
FIG. 7 is a graph showing a relationship between the warpage amount of the silicon carbide epitaxial wafer and an outer diameter of the wafer.

FIG. 7 shows the relationship between the warpage amount of the silicon carbide epitaxial wafer and the outer diameter of the wafer.

FIG. 7 shows a result obtained as follows. With respect to the warpage amount obtained for a silicon carbide epitaxial wafer in which an epi layer having a thickness of 240 μm is formed on a substrate having an outer diameter of 3 inches (75 mm), since the curvature radius of the warpage was about 24.2 m, based on this radius of curvature, the warpage amount when the outer diameter of the wafer was 100 μm, 150 nm or 200 μm was calculated. As the outer diameter of the wafer increases, the effective warpage amount increases. Conversely, the effect of warpage correction of the present invention becomes more prominent as the outer diameter of the wafer becomes larger. At present, a production line for 6-inch SiC wafers has started operation, and the present invention is highly effective when a silicon carbide epitaxial wafer having a thick film is used in the process of manufacturing a large wafer.

<Relationship Between Warpage of Silicon Carbide Epitaxial Wafer and Doping>

The main cause of warpage occurrence in the silicon carbide epitaxial wafer is the thickly formed silicon carbide layer. As a mechanism for further increasing the warpage, a difference in lattice constant which is caused by doping into the silicon carbide substrate and the silicon carbide layer can be considered.

Nitrogen (N) is mainly used as a donor in order to produce an n-type silicon carbide semiconductor, but nitrogen is known to act in a direction to decrease the lattice constant of silicon carbide. Further, boron (B) or aluminum (Al) is mainly used as an acceptor in order to produce a p-type silicon carbide semiconductor. Here, it is known that boron acts in a direction to decrease the lattice constant of silicon carbide, whereas aluminum acts in a direction to increase the lattice constant of silicon carbide. Therefore, the following cases can be considered for the situation where the epi layer growth surface side becomes easily warped convexly when a thick silicon carbide layer 2 is grown on a silicon carbide substrate 1.

(1) A case where the silicon carbide substrate 1 is doped with a high concentration of dopant which decreases the lattice constant, and the silicon carbide layer 2 is either non-doped or doped at a low concentration. In the case where the silicon carbide substrate 1 is an n-type layer, it is conceivable to dope nitrogen alone, or to codope nitrogen and boron or aluminum which is added at a concentration of ⅕ or less of that of nitrogen. Further, in the case where the silicon carbide substrate 1 is a p-type layer, it is conceivable to dope boron alone, or to codope boron and nitrogen which is added at a concentration of ⅕ or less of that of boron. The doping concentration into the silicon carbide substrate 1 is typically $1 \times 10^{18}$ cm$^{-3}$ or more, preferably $5 \times 10^{18}$ cm$^{-3}$ or more, and more preferably $1 \times 10^{19}$ cm$^{-3}$ or more. The doping concentration into the silicon carbide layer 2 is typically ¹⁄₁,₀₀₀ or less, preferably ¹⁄₅,₀₀₀ or less, and more preferably ¹⁄₁₀,₀₀₀ or less of that of the silicon carbide substrate 1. That is, since the silicon carbide layer 2 is non-doped or doped at a low concentration, the lattice constant hardly changes. Therefore, since the dopant to the silicon carbide layer 2 has a low concentration, it can be any one of nitrogen, boron and aluminum, or a combination thereof. As a result, the lattice constant of the silicon carbide layer 2 becomes relatively larger than that of the silicon carbide substrate 1.

(2) A case where the silicon carbide substrate 1 is either non-doped or doped at a lower concentration than in the silicon carbide layer, and the silicon carbide layer 2 is doped with a high concentration of aluminum which increases the lattice constant. The doping concentration into the silicon carbide substrate 1 is typically ¹⁄₁,₀₀₀ or less, preferably ¹⁄₅,₀₀₀ or less, and more preferably ¹⁄₁₀,₀₀₀ or less of that of the silicon carbide layer 2. Since the silicon carbide substrate 1 is non-doped or doped at a low concentration, the lattice constant hardly changes. At this time, since the dopant to the silicon carbide substrate 1 has a low concentration, it can be any one of nitrogen, boron and aluminum, or a combination thereof. The aluminum doping concentration to the silicon carbide layer 2 is typically $1 \times 10^{18}$ cm$^{-3}$ or more, preferably $5 \times 10^{18}$ cm$^{-3}$ or more, and more preferably $1 \times 10^{19}$ cm$^{-3}$ or more. For the silicon carbide layer 2, it is conceivable to codope with nitrogen which is added at a concentration of ⅕ or less of that of aluminum. As a result, the lattice constant of the silicon carbide layer 2 becomes relatively larger than that of the silicon carbide substrate 1.

(3) To summarize the above cases (1) and (2), the following case may be considered. The silicon carbide substrate 1 and the silicon carbide layer 2 are doped with either one or both of a donor and an acceptor so that the lattice constant of the silicon carbide layer 2 is relatively larger than the lattice constant of the silicon carbide substrate 1, and the doping concentrations differ between the silicon carbide substrate 1 and the silicon carbide layer 2 by 1,000 times or more, preferably by 5,000 times or more, and more preferably by 10,000 times or more.

IGBTs, high-voltage MOSFETs, and PIN diodes are recognized at the moment as applications requiring a silicon carbide epitaxial wafer having a thick film. In IGBTs, for example, a silicon carbide epitaxial wafer in which an n-type epitaxial layer (doped with nitrogen, doping concentration of $2 \times 10^{14}$ cm$^{-3}$ or less) is formed on a p-type substrate (doped with boron or codoped with boron and nitrogen, doping concentration of $2 \times 10^{19}$ cm$^{-3}$ or more) is used. In high-voltage MOSFETs and PIN diodes, for example, a silicon carbide epitaxial wafer in which an n-type epitaxial layer (doped with nitrogen, impurity concentration of $5 \times 10^{14}$ cm$^{-3}$ or less) is formed on an n-type substrate (doped with nitrogen, doping concentration of $5 \times 10^{18}$ cm$^{-3}$ or more) is used. At this time, a codoped substrate doped with both nitrogen and an acceptor (boron or aluminum) may be used for the n-type substrate. It should be noted that in the case of an n-type codoped substrate, the nitrogen concentration is increased so as to be about 5 times higher than that of the acceptor. These applications correspond to the above cases (1) and (3), and the present invention is typically applied.

(Method for Producing Silicon Carbide Epitaxial Wafer)

A method for manufacturing a silicon carbide epitaxial wafer according to the present invention includes: a step of preparing a silicon carbide substrate having a first principal plane and a second principal plane opposed thereto, and processing the aforementioned silicon carbide substrate so that a second principal plane side of the aforementioned silicon carbide substrate has a convex shape when the aforementioned first principal plane is on the upper side; and a step of epitaxially growing a silicon carbide layer on the aforementioned first principal plane of the aforementioned silicon carbide substrate.

With reference to FIG. 8, the main difference between the method of manufacturing a silicon carbide epitaxial wafer of the present invention and the conventional method of manufacturing a silicon carbide epitaxial wafer will be described. (b) of FIG. 8 is a schematic cross-sectional view for explaining a conventional method of manufacturing a silicon carbide epitaxial wafer, which includes: (i) a step of preparing a substrate; and (ii) a step of epitaxially growing on the substrate. As shown in (a) of FIG. 8, the method of manufacturing a silicon carbide epitaxial wafer of the present invention includes: (ii) a step of processing the substrate so that the lower side has a convex shape, between the step (i) of preparing a substrate; and the step (iii) of epitaxially growing on the substrate.

As a method of processing the silicon carbide substrate so that the second principal plane side has a convex shape, the surface roughness of the second principal plane (back surface) is increased, and the second principal plane side (lower side) is formed into a convex shape by utilizing the Twyman effect.

As a method for increasing the surface roughness of the second principal plane (back surface), a known method can be used, and examples thereof include a grinding process and a polishing process. Either the polishing process or the grinding process may be employed, or the polishing process and the grinding process may be employed in combination.

EXAMPLES

Hereinafter, the present invention will be described in more detail based on a series of examples, but the present invention is not limited by these examples.

Example 1

<Preparation and Processing of Silicon Carbide Substrate>

A silicon carbide substrate having a 4H crystal structure in which a (0001) Si plane was inclined by 4 degrees in the <11-20> direction and having an outer diameter of 75 mm was prepared. A surface of the silicon carbide substrate on the (000-1) C plane side was subjected to a grinding process to set the surface roughness to 122 nm. In the grinding process, infeed grinding using a diamond wheel having a mesh size of #230 with an abrasive grain size of 70 to 80 μm was performed by employing a commercially available grinding machine. The silicon carbide substrate used at this time was a nitrogen-doped n-type substrate, and the specification value of nitrogen concentration was 5 to $8 \times 10^{18}$ $cm^{-3}$.

<Hydrogen Heating Step>

In a state where the silicon carbide substrate was introduced into a reaction furnace of a chemical vapor deposition apparatus and hydrogen gas was introduced at a flow rate of 30 slm, the pressure in the reaction furnace was maintained at 2.7 kPa, and the aforementioned silicon carbide substrate was heated to 1,590° C. by a high frequency induction heating portion. Heating in this state was carried out for 30 minutes.

<Epitaxially Grown Layer Forming Step>

Subsequently, an epitaxially grown layer having a thickness of 240 μm with an n-type carrier concentration of $2 \times 10^{14}$ $cm^{-3}$ was formed on the (0001) Si plane of the aforementioned silicon carbide substrate by introducing silane, propane and nitrogen into the reaction furnace at flow rates of 54 sccm, 21 sccm and 8 sccm, respectively.

The silicon carbide epitaxial wafer according to Example 1 was manufactured by the above procedure.

Comparative Example 1

A silicon carbide epitaxial wafer according to Comparative Example 1 was produced in the same manner as in Example 1 except that the grinding process was not performed on the surface of the silicon carbide substrate on the (000-1) C plane side, and the surface roughness was 0.1 nm.

Example 2

A silicon carbide epitaxial wafer according to Example 2 was produced in the same manner as in Example 1 except that the grinding process to set the surface roughness to 59 nm was performed on the surface of the silicon carbide substrate on the (000-1) C plane side, and the thickness of the epitaxially grown layer was set to 200 μm. It should be noted that in the grinding process at this time, a diamond wheel having a mesh size of #400 with an abrasive grain size of 30 to 40 μm was used.

Comparative Example 2

Further, a silicon carbide epitaxial wafer according to Comparative Example 2 was produced in the same manner as in Example 2 except that the grinding process was not performed on the surface of the silicon carbide substrate on the (000-1) C plane side, and the surface roughness was 0.1 nm.

<Measurement of Warpage Amount>

The warpage measurement of the silicon carbide substrate and the silicon carbide epitaxial wafer was evaluated in a non-adsorbed state using a vertical incidence interferometer. With the (0001) Si plane side facing upward, the warpage value in the case of a convex shape as shown in (b) of FIG. 1 is denoted by the plus symbol (+), and the warpage value in the case of a concave shape as shown in (a) of FIG. 1 is denoted by the minus symbol (−).

The results of warpage measurement of the silicon carbide substrate and the silicon carbide epitaxial wafer are shown in Table 1 below.

TABLE 1

| Examples/ Comparative Examples | Surface roughness of back surface (nm) | Warpage of silicon carbide substrate before hydrogen heating step (μm) | Warpage of silicon carbide substrate after hydrogen heating step (μm) | Thickness of epitaxially grown layer (μm) | Warpage of silicon carbide epitaxial wafer (μm) |
|---|---|---|---|---|---|
| Example 1 | 122 | −116 | −43 | 240 | −8 |
| Example 2 | 59 | −112 | −27 | 200 | 5 |
| Comp. Ex. 1 | 0.1 | 0 | 0 | 240 | 29 |
| Comp. Ex. 2 | 0.1 | 0 | 0 | 200 | 27 |

As shown in Table 1, by grinding the surface of the silicon carbide substrate on the (000-1) C plane side and forming it into a concave shape as a whole before forming the epitaxially grown layer, it was possible to set the warpage of the silicon carbide epitaxial wafer to 20 μm or less.

On the other hand, when the surface of the silicon carbide substrate on the (000-1) C plane side was not ground, the warpage of the silicon carbide epitaxial wafer was 20 μm or more.

Although the invention made by the present inventors has been specifically described above based on the above embodiments, needless to say, the present invention is not limited to the above embodiments and various modifications can be made without departing from the spirit and scope of the present invention.

Figure 9:
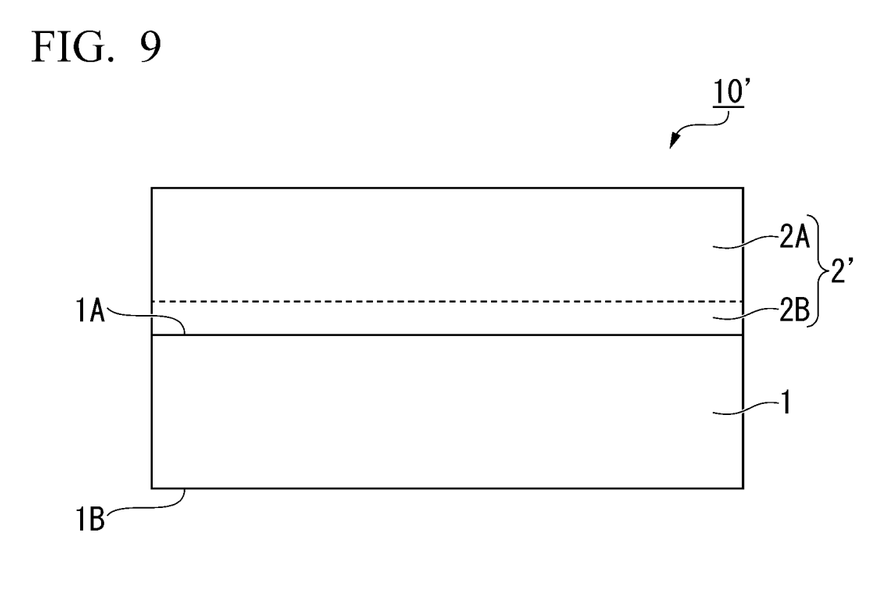
FIG. 9 is a cross-sectional view schematically showing a silicon carbide epitaxial wafer according to another embodiment of the present invention.

In the embodiments of the invention described above, a silicon carbide epitaxial wafer in which a silicon carbide layer of a single layer is laminated on a silicon carbide substrate has been exemplified as the simplest example. However, in a practical application, as shown in FIG. 9, it is common to use a thin silicon carbide intermediate layer 2B between the silicon carbide substrate 1 and a thick silicon carbide layer 2A. A silicon carbide epitaxial wafer 10' shown in FIG. 9 is a silicon carbide epitaxial wafer including: a silicon carbide substrate 1; and a silicon carbide layer 2' provided on a first principal plane 1A of the silicon carbide substrate 1 and having a film thickness of 100 μm or more, wherein the warpage amount of the silicon carbide epitaxial wafer is −20 μm or more and 20 μm or less, and the silicon carbide layer 2' includes a thick silicon carbide layer 2A (for example, a drift layer having a thickness of about 150 to 350 μm as described later) and a thin silicon carbide intermediate layer 2B (for example, a collector layer having a thickness of about 1 to 10 μm as described later and/or a field stop layer having a thickness of about 0.5 to 2 μm). Since the inclusion of the thick silicon carbide layer 2A is a cause of warpage, the problems of the present invention are common even if the thin silicon carbide intermediate layer 2B is used, and the invention based on the embodiments can be suitably applied.

For example, in an n-channel IGBT, an epitaxial wafer is prepared, in which a collector layer (p-type, doping concentration: about $1 \times 10^{18}$ to $1 \times 10^{19}$ cm$^{-3}$, thickness: about 1 to 10 μm), a field stop layer (n-type, doping concentration: about $1 \times 10^{17}$ to $1 \times 10^{18}$ cm$^{-3}$, thickness: about 0.5 to 2 μm) and a thick drift layer (n-type, doping concentration: about $2 \times 10^{14}$ cm$^{-3}$, thickness: about 150 to 350 μm) are formed in order, while being in contact with a p-type silicon carbide substrate. Further, a gate and an emitter similar to a vertical MOSFET are formed on the surface of the drift layer. In other words, the silicon carbide layer in the embodiment of the present invention is understood to include, in addition to the thick drift layer, an intermediate layer (multilayer film of a collector layer and/or a field stop layer) which is sufficiently thin (for example, 1/10 or less) with respect to the drift layer. The above-mentioned "relationship between warpage of silicon carbide epitaxial wafer and doping" may be interpreted as a relationship between the doping concentration of the thickest silicon carbide layer provided either directly or via the intermediate layer on the silicon carbide substrate and the doping concentration of the silicon carbide substrate. Since the intermediate layer is thin, the doping species and concentration of impurities have little influence on the warpage.

Further, in a PIN diode or a high-voltage MOSFET, an epitaxial wafer is prepared, in which a thick drift layer (n-type, doping concentration: about $5 \times 10^{14}$ cm$^{-3}$, thickness: about 100 to 300 μm) is formed in order via a buffer layer (n-type, doping concentration: about $1 \times 10^{18}$ cm$^{-3}$, thickness: about 0.5 to 1 μm) on an n-type silicon carbide substrate. Further, a diode structure or a MOSFET structure is formed on the surface of the drift layer. Here too, it is understood that the silicon carbide layer in the embodiments and examples of the invention refers to the drift layer and the intermediate layer (buffer layer) as a whole.

As described above, the intermediate layer is not limited to the above-described collector layer, field stop layer and buffer layer, but is a single layer or a plurality of layers of silicon carbide used for optimization of the device structure.

(Supplementary Note 1)

A silicon carbide epitaxial wafer including: a silicon carbide substrate; and a silicon carbide layer provided on a first principal plane of the silicon carbide substrate and having a film thickness of 100 μm or more, wherein a warpage amount of the silicon carbide epitaxial wafer is −20 μm or more and 20 μm or less.

(Supplementary Note 2)

The silicon carbide epitaxial wafer according to supplementary note 1, wherein the silicon carbide substrate and the silicon carbide layer are doped with either one or both of a donor and an acceptor so that the lattice constant of the silicon carbide layer is relatively larger than the lattice constant of the silicon carbide substrate, and a doping concentration difference between the silicon carbide substrate and the silicon carbide layer is 1,000 times or more.

(Supplementary Note 3)

The silicon carbide epitaxial wafer according to supplementary note 1 or 2, wherein the silicon carbide substrate is added with a first impurity by any one of the following procedures: (i) doping with nitrogen alone, (ii) doping with boron alone, (iii) doping mainly with nitrogen and boron or aluminum which is added at a concentration of 1/5 or less of that of nitrogen, and (iv) doping mainly with boron and nitrogen which is added at a concentration of ⅕ or less of that of boron, the silicon carbide layer is added with a second impurity by any one of the following procedures: (i) non-doping, (ii) doping with nitrogen alone, (iii) doping with boron alone, (iv) doping with aluminum alone, and (v) doping with a combination of two or three of nitrogen, boron and aluminum, and a concentration of the first impurity is 1,000 times or more than a concentration of the second impurity.

(Supplementary Note 4)

The silicon carbide epitaxial wafer according to any one of supplementary notes 1 to 3, wherein the silicon carbide layer includes an intermediate layer in contact with the silicon carbide substrate and a drift layer formed on the intermediate layer, and a thickness of the intermediate layer is ​1/10 or less than a thickness of the drift layer.

DESCRIPTION OF THE REFERENCE SYMBOLS

1: Silicon carbide substrate
1A: First principal plane
1B: Second principal plane
2: Silicon carbide layer
10: Silicon carbide epitaxial wafer

What is claimed is:

1. A silicon carbide epitaxial wafer comprising:
a silicon carbide substrate, which is a single crystal; and
a silicon carbide layer provided on a first principal plane of the silicon carbide substrate and having a film thickness of 100 µm or more, the silicon carbide layer being a silicon carbide epitaxial layer,
wherein a warpage amount of the silicon carbide epitaxial wafer is −20 µm or more and 20 µm or less, and
wherein a surface roughness of a second principal plane of the silicon carbide substrate that is opposed to the first principal plane of the silicon carbide substrate is 20 nm or more.

2. The silicon carbide epitaxial wafer according to claim 1, wherein a total thickness of the silicon carbide substrate and the silicon carbide layer is 450 µm or more.

3. The silicon carbide epitaxial wafer according to claim 1, wherein a total thickness of the silicon carbide substrate and the silicon carbide layer is 600 µm or more.

4. The silicon carbide epitaxial wafer according to claim 1, wherein the silicon carbide substrate is a 4H-SiC substrate.

5. The silicon carbide epitaxial wafer according to claim 1, wherein an outer diameter of the silicon carbide substrate is 75 mm or more.

6. The silicon carbide epitaxial wafer according to claim 1, wherein the silicon carbide substrate and the silicon carbide layer are doped with either one or both of a donor and an acceptor so that the lattice constant of the silicon carbide layer is relatively larger than the lattice constant of the silicon carbide substrate, and a doping concentration difference between the silicon carbide substrate and the silicon carbide layer is 1,000 times or more.

7. The silicon carbide epitaxial wafer according to claim 6, wherein the silicon carbide substrate is a 4H-SiC substrate, and an outer diameter of the silicon carbide substrate is 75 mm or more.

8. The silicon carbide epitaxial wafer according to claim 1, wherein the silicon carbide substrate is added with a first impurity by any one of the following procedures: (i) doping with nitrogen alone, (ii) doping with boron alone, (iii) doping mainly with nitrogen and boron or aluminum which is added at a concentration of ⅕ or less of that of nitrogen, and (iv) doping mainly with boron and nitrogen which is added at a concentration of ⅕ or less of that of boron, the silicon carbide layer is added with a second impurity by any one of the following procedures: (i) non-doping, (ii) doping with nitrogen alone, (iii) doping with boron alone, (iv) doping with aluminum alone, and (v) doping with a combination of two or three of nitrogen, boron and aluminum, and a concentration of the first impurity is 1,000 times or more than a concentration of the second impurity.

9. The silicon carbide epitaxial wafer according to claim 1, wherein the silicon carbide layer includes an intermediate layer in contact with the silicon carbide substrate and a drift layer formed on the intermediate layer, and a thickness of the intermediate layer is ​1/10 or less than a thickness of the drift layer.

10. The silicon carbide epitaxial wafer according to claim 1, wherein the silicon carbide substrate is a 4H-SiC substrate, and an outer diameter of the silicon carbide substrate is 75 mm or more.

11. The silicon carbide epitaxial wafer according to claim 1, wherein the warpage amount is a difference in height between a highest position and a lowest position in a principal plane of the silicon carbide epitaxial wafer with respect to a plane, wherein the difference is measured such that the silicon carbide epitaxial wafer is placed on the plane and the principal plane is not facing the plane.

12. The silicon carbide epitaxial wafer according to claim 1, wherein the silicon carbide substrate includes a donner of nitrogen (N) with a doping concentration of $5 \times 10^{18}$ cm$^{-3}$ or more, and a doping concentration of the silicon carbide layer is ​1/5,000 or less of that of the silicon carbide substrate.

13. The silicon carbide epitaxial wafer according to claim 12, wherein the doping concentration of the silicon carbide layer is ​1/10,000 or less of that of the silicon carbide substrate.

14. The silicon carbide epitaxial wafer according to claim 1, wherein the silicon carbide substrate is a 4H-SiC substrate and the silicon carbide layer is a 4H-SiC single crystal layer.

15. A method for manufacturing the silicon carbide epitaxial wafer according to claim 1, the method comprising: preparing the silicon carbide substrate having the first principal plane and the second principal plane opposed thereto; processing the silicon carbide substrate so that the second principal plane of the silicon carbide substrate has a convex shape; and epitaxially growing the silicon carbide layer on the first principal plane of the silicon carbide substrate.

16. The method for manufacturing the silicon carbide epitaxial wafer according to claim 15, wherein the processing step comprises polishing and/or grinding so that a surface roughness of the second principal plane is 20 nm or more.

17. The method for manufacturing the silicon carbide epitaxial wafer according to claim 15, wherein the epitaxially growing step comprises epitaxially growing the silicon carbide layer to a thickness of 100 µm or more.

* * * * *

UNITED STATES PATENT AND TRADEMARK OFFICE
CERTIFICATE OF CORRECTION

PATENT NO. : 10,879,359 B2
APPLICATION NO. : 16/280083
DATED : December 29, 2020
INVENTOR(S) : Keiko Masumoto et al.

Page 1 of 1

It is certified that error appears in the above-identified patent and that said Letters Patent is hereby corrected as shown below:

On the Title Page

Title (54) should read as follows:
SILICON CARBIDE EPITAXIAL WAFER HAVING A THICK SILICON CARBIDE LAYER WITH SMALL WARPAGE AND MANUFACTURING METHOD THEREOF Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*